US007105264B2

(12) United States Patent
Toyoda

(10) Patent No.: US 7,105,264 B2
(45) Date of Patent: Sep. 12, 2006

(54) METHOD FOR FORMING PATTERNED CONDUCTIVE FILM, ELECTROOPTICAL DEVICE, AND ELECTRONIC APPLIANCE

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/930,759

(22) Filed: Sep. 1, 2004

(65) Prior Publication Data

US 2005/0095866 A1    May 5, 2005

(30) Foreign Application Priority Data

Sep. 2, 2003  (JP) .............................. 2003-310071

(51) Int. Cl.
G03F 7/34 (2006.01)
G03F 7/40 (2006.01)
H01L 21/44 (2006.01)

(52) U.S. Cl. ...................... 430/198; 430/200; 430/311; 430/330; 430/964; 438/662; 438/669

(58) Field of Classification Search ................ 430/198, 430/200, 330, 311, 964; 438/662, 669
See application file for complete search history.

(56) References Cited

U.S. PATENT DOCUMENTS

| 4,931,323 | A | * | 6/1990 | Manitt et al. ................. 427/555 |
| 4,942,110 | A | * | 7/1990 | Genovese et al. ........... 430/198 |
| 5,685,939 | A | * | 11/1997 | Wolk et al. ................... 156/234 |
| 2002/0090565 | A1 | * | 7/2002 | Griffith et al. ............... 430/198 |
| 2003/0146019 | A1 | * | 8/2003 | Hirai ............................ 174/257 |
| 2006/0003262 | A1 | * | 1/2006 | Yang et al. .................. 430/311 |

FOREIGN PATENT DOCUMENTS

| JP | 03262187 | * 11/1991 |
| JP | A 5-21387 | 1/1993 |
| JP | A-2003-215816 | 7/2000 |
| JP | A-2001-168061 | 6/2001 |
| KR | 10-0349282 | 4/2001 |

* cited by examiner

Primary Examiner—Richard L. Schilling
(74) Attorney, Agent, or Firm—Oliff & Berridge, PLC

(57) ABSTRACT

Exemplary embodiments of the present invention provide a method to form a patterned conductive film by modifying a conductive thin film on a substrate irrespective of the material used for the substrate. Exemplary embodiments include a substrate having a conductive layer containing a conductive material and a photothermal conversion layer containing a photothermal conversion material that converts light energy into heat energy that is irradiated with a laser beam to fire at least part of the conductive layer with the photothermal conversion material.

14 Claims, 7 Drawing Sheets

METHOD FOR FORMING PATTERNED CONDUCTIVE FILM, ELECTROOPTICAL DEVICE, AND ELECTRONIC APPLIANCE

BACKGROUND OF THE INVENTION

1. Field of Invention

Exemplary embodiments of the present invention provide methods to form a patterned conductive film, electrooptical devices, and electronic appliances.

2. Description of Related Art

The related art includes a conductive thin film formed on a substrate modified by heat treatment. Related art document Japanese Unexamined Patent Application Publication No. 5-21387 discloses a laser annealing technique to modify a thin metal film formed on a substrate by laser irradiation.

SUMMARY OF THE INVENTION

After a functional liquid containing a conductive material is applied onto a substrate, the applied liquid is fired by laser irradiation to develop its conductivity. In order for the firing to be sufficient, high-power laser irradiation is required. Such laser irradiation, however, causes problems including heat distortion if, for example, the substrate is composed of a material having no heat resistance, such as a plastic.

Exemplary embodiments of the present invention provide methods to form a patterned conductive film by modifying a conductive thin film on a substrate irrespective of the material used for the substrate. Exemplary embodiments of the present invention provide an electrooptical device and electronic appliance including a patterned conductive film formed by the above method.

To address or solve the above and/or other problems, exemplary embodiments of the present invention provide a method to form a patterned conductive film, including irradiating with light a substrate that is provided with a conductive layer including a conductive material and includes a photothermal conversion material that converts light energy into heat energy to fire at least part of the conductive layer with the photothermal conversion material. According to exemplary embodiments of the present invention, the substrate, including the photothermal conversion material, can efficiently convert the light energy of the emitted light into heat energy. The substrate can therefore supply the conductive layer with sufficient heat energy to fire the conductive layer to develop its conductivity. According to exemplary embodiments of the present invention, additionally, the photothermal conversion material is irradiated with light to generate instantaneous high heat, thereby firing the conductive layer in a short time. According to exemplary embodiments of the present invention, furthermore, the substrate is instantaneously supplied with heat energy. Even if, for example, the substrate is composed of a material having no heat resistance, such as a plastic, the effect on the substrate can be reduced or suppressed. In the method to form a patterned conductive film according to exemplary embodiments of the present invention, a predetermined region of the substrate may be irradiated with light to pattern the conductive layer, thereby forming a conductive film having a pattern according to the irradiated region on the substrate.

The method to form a patterned conductive film according to exemplary embodiments of the present invention may further include a material application step of applying a functional liquid including the conductive material onto the substrate including the photothermal conversion material before the firing step. According to this exemplary method, a patterned conductive film can be formed simply by irradiating with light the functional liquid (coating liquid) applied onto the substrate by, for example, any coating method or droplet ejection method. This method may further include an intermediate drying step of drying the functional liquid applied onto the substrate between the material application step and the firing step. The intermediate drying step after the material application step, allows the removal of part of the liquid content of the functional liquid applied on the substrate to facilitate the following firing step. In addition, the material application step and the intermediate drying step may be repeated. A film of the functional liquid applied onto the substrate can be excellently coated with another film of the functional liquid to increase the thickness of the patterned conductive film to be formed, thus providing a patterned conductive film having desired conductivity.

In the method to form a patterned conductive film according to exemplary embodiments of the present invention, a photothermal conversion layer including the photothermal conversion material may be independently provided on the substrate such that the photothermal conversion layer and the conductive layer are adjacent on the substrate. Alternatively, the photothermal conversion material may be mixed in the substrate. In either manner, the heat energy generated by the photothermal conversion material can be supplied to the conductive layer to fire the conductive layer. In particular, the heat energy generated in the photothermal conversion layer can be efficiently supplied to the conductive layer if the photothermal conversion layer and the conductive layer are adjacent.

The method to form a patterned conductive film according to exemplary embodiments of the present invention may further include removing the unfired part of the conductive layer after the firing step. This step allows the removal of a nonconductive part from the substrate.

In the method to form a patterned conductive film according to exemplary aspects of the present invention, the substrate may be irradiated with light on the side on which the conductive layer is provided, or may be irradiated with light on the side on which the conductive layer is not provided. In either manner, the photothermal conversion material can convert light energy to heat energy to supply the heat energy to the conductive layer.

In the method to form a patterned conductive film according to exemplary embodiments of the present invention, a patterned conductive film may be formed on a predetermined board by bringing the board into contact with the conductive layer on the substrate and irradiating a predetermined region of the substrate with light to transfer the part of the conductive layer corresponding to the predetermined region onto the board. That is, the patterned conductive film, which is formed on the substrate, may be transferred onto a predetermined board by irradiation with light. Then the patterned conductive film transferred onto the board may be further irradiated with light, thereby reliably firing the patterned conductive film on the board to develop its conductivity.

In the method to form a patterned conductive film according to exemplary embodiments of the present invention, the light may be a laser beam, and the irradiation may be performed with light having a wavelength according to the photothermal conversion material. The photothermal conversion material can efficiently convert the light energy of such light into heat energy.

In the method to form a patterned conductive film according to exemplary embodiments of the present invention, the irradiation may be performed through a mask having a predetermined pattern to irradiate the substrate with light passing through the mask. The mask enables the formation of a conductive film having a pattern finer than the beam diameter of the light emitted. Alternatively, the irradiation may be performed while relatively moving the substrate with respect to the light. That is, the light (laser beam) and the substrate may be relatively moved to pattern the conductive layer. This manner can eliminate a step of preparing the mask.

Exemplary embodiments of the present invention provide an electrooptical device including a patterned conductive film formed by the above method and an electronic appliance including the electrooptical device. According to exemplary embodiments of the present invention, the electrooptical device and the electronic appliance including the electrooptical device can be manufactured with high productivity and have desirable performance. Examples of the electrooptical device include liquid crystal displays, organic electroluminescent (EL) displays, and plasma displays.

The conductive layer or the photothermal conversion layer may be provided on the substrate by droplet ejection. In the droplet ejection, droplets of the functional liquid are ejected and applied onto the substrate. The droplet ejection is implemented with a droplet ejection machine having a discharge head. The droplet ejection machine is exemplified by an inkjet machine having an inkjet head. The inkjet head can eject a constant amount of droplets of a liquid material (the functional liquid) by inkjetting. For example, the inkjet machine constantly ejects 1 to 300 ng of liquid material per dot. The droplet ejection machine used may also be a dispenser.

The liquid material is a medium having a sufficient viscosity to allow the ejection of droplets from a discharge nozzle of a discharge head of a droplet ejection machine. The liquid material may be either water-based or oil-based. The liquid material may also contain a solid material as long as keeping a sufficient liquidity (viscosity) to allow ejection from, for example, a discharge nozzle. The material contained in the liquid material may be a material melted by heating to its melting point or higher or microparticles stirred in a solvent. In addition to the solvent, the liquid material may contain a functional additive such as a dye and a pigment.

The functional liquid, which is a liquid material containing a functional material, herein refers to the material to form a patterned conductive film (wiring pattern) that distributes electric power. This material contains a conductive material such as a metal. Other examples of the functional liquid include materials that are applied onto a substrate to have a predetermined function, such as materials to form liquid crystal displays including a color filter, materials to form organic EL displays, and materials to form plasma displays.

DETAILED DESCRIPTION OF PREFERRED EMBODIMENTS

Methods to form a patterned conductive film according to exemplary embodiments of the present invention will now be described with reference to the drawings.

Figure 1:
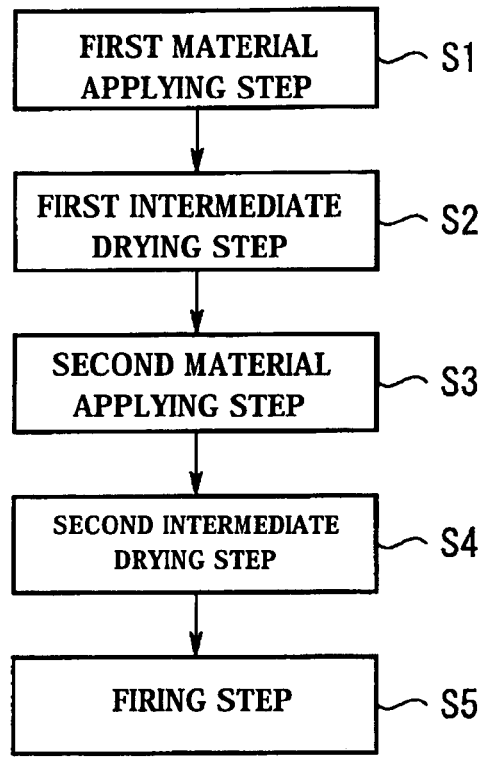
FIG. 1 is a flow chart of a method to form a patterned conductive film according to an exemplary embodiment of the present invention.

FIG. 1 is a flow chart of a method to form a patterned conductive film according to an exemplary embodiment of the present invention. In FIG. 1, the method to form a patterned conductive film according to this exemplary embodiment includes a first material application step (Step S1) of applying a functional liquid containing a photothermal conversion material onto a substrate; a first intermediate drying step (Step S2) of drying the functional liquid applied on the substrate to form a photothermal conversion layer; a second material application step (Step S3) of applying another functional liquid containing a conductive material onto the photothermal conversion layer; a second intermediate drying step (Step S4) of drying the functional liquid applied on the photothermal conversion layer to form a conductive layer; and a firing step (Step S5) of firing at least part of the conductive layer using the photothermal conversion material by irradiation.

The individual steps are described below.

[First Material Application Step]

A substrate 1 is cleaned with, for example, a predetermined solvent to remove residues such as organic materials. Such residues may also be removed by ultraviolet irradiation of a surface of the substrate 1. Ultraviolet irradiation additionally provides the surface of the substrate 1 with lyophilicity. Alternatively, the substrate 1 may be cleaned and provided with lyophilicity by O2 plasma processing using a gas containing oxygen (O2) as a processing gas. Subsequently, a functional liquid containing a photothermal conversion material is applied onto the substrate 1 by a predetermined coating method.

The substrate 1 used may be, for example, a substrate that can transmit a laser beam, such as a glass substrate and a transparent polymer substrate. Examples of such a transparent polymer include polyesters such as polyethylene terephthalate, acrylic polymers, epoxy polymers, polyethylene, polystyrene, polycarbonates, polysulfones, and polyimides. If the substrate 1 is composed of a transparent polymer, the substrate 1 preferably has a thickness of 10 to 500 μm. With such a thickness, for example, the substrate 1 can be formed in a strip and be rolled around a rotating drum for carrying (transfer).

The photothermal conversion material converts light energy into heat energy. This photothermal conversion material may be any known material that can efficiently convert light into heat. Examples of the material used include aluminum, aluminum oxide, and/or aluminum sulfide; carbon black; graphite; and organic polymers containing, for example, an infrared-absorbing dye. Examples of the infrared-absorbing dye used include anthraquinone dyes, dithiol nickel complex dyes, cyanine dyes, azo cobalt complex dyes, diimmonium dyes, squarylium dyes, phthalocyanine dyes, and naphthalocyanine dyes. Alternatively, the photothermal conversion material may be applied onto the substrate 1 by dissolving or dispersing the photothermal conversion material in a binder of a synthetic resin such as an epoxy resin. The epoxy resin functions as a curing agent; it can be cured to fix the photothermal conversion material on the substrate 1. Naturally, the photothermal conversion material may be provided onto the substrate 1 without being dissolved or dispersed in a binder.

In this exemplary embodiment, after the functional liquid is prepared by dissolving (dispersing) the photothermal conversion material in a solvent (dispersion medium), this liquid is applied onto the substrate 1 by a general film coating method such as extrusion coating, spin coating, gravure coating, reverse roll coating, rod coating, microgravure coating, and knife coating. In the coating with the photothermal conversion material, preferably, static charge on the surface of the substrate 1 is eliminated to enable uniform application of the functional liquid onto the substrate 1. Thus the coating apparatus used is preferably equipped with a static eliminator. These coating methods are particularly preferred when the above organic materials are used as the photothermal conversion material. If, on the other hand, the above metals are used as the photothermal conversion material, the photothermal conversion material may be provided on the substrate 1 by vacuum deposition, electron beam deposition, or sputtering. Alternatively, the functional liquid containing the photothermal conversion material may be applied onto the substrate 1 by droplet ejection (inkjetting).

In the droplet ejection, droplets of the functional liquid are ejected from a discharge head facing the substrate 1. Examples of droplet ejection techniques include a charge control system, a pressure vibration system, an electrothermal conversion system, an electrostatic attraction system, and an electromechanical conversion system. In the charge control system, the material is electrically charged by charging electrodes and is ejected from a discharge nozzle while controlling the traveling direction of the material by deflecting electrodes. In the pressure vibration system, the material is ejected from a nozzle by applying a very high pressure of about 30 kg/cm2. If no control voltage is applied, the material travels in a straight line to exit from the nozzle. If, on the other hand, a control voltage is applied, electrostatic repulsion scatters the material, which therefore cannot exit from the nozzle. In the electrothermal conversion system, the material is rapidly vaporized by a heater provided in a chamber storing the material to generate bubbles. These bubbles exert pressure on the material in the chamber to eject the material. In the electrostatic attraction system, a slight pressure is applied into a chamber storing the material to form a meniscus of the material at a discharge nozzle, and electrostatic attraction is then applied to eject the material. The electromechanical conversion system utilizes a piezoelectric element; it distorts in response to electric pulses to apply pressure through a flexible material into a chamber storing the material, thereby extruding the material from the chamber to eject the material from a discharge nozzle. Other applicable techniques include a system utilizing changes in fluid viscosity due to electric fields and a system utilizing discharge sparks. Droplet ejection has advantages such as low needless material consumption and accurate application of a desired amount of material onto desirable positions. The amount of each droplet ejected is, for example, 1 to 300 ng. This exemplary embodiment employs the electromechanical conversion system (piezoelectric system).

Figure 2:
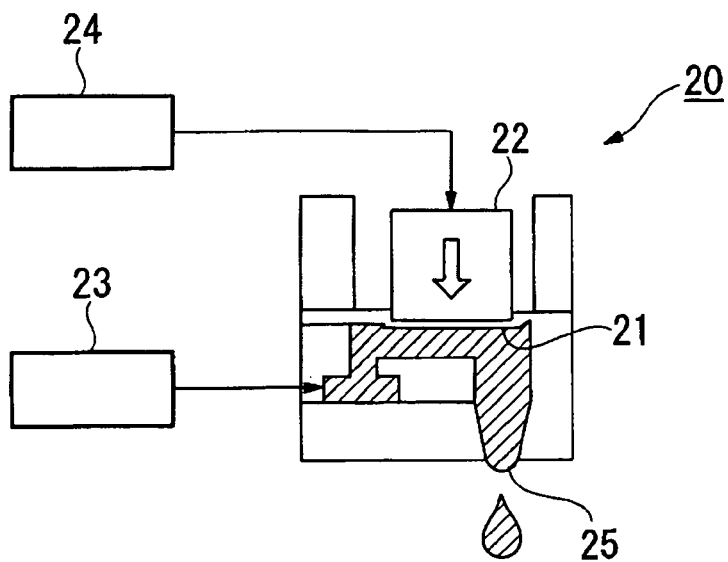
FIG. 2 is a schematic showing a discharge head to apply a functional liquid.

FIG. 2 is a schematic that shows the ejection mechanism of the functional liquid (liquid material) in the piezoelectric system. In FIG. 2, a discharge head 20 includes a liquid chamber 21 to store the functional liquid and a piezoelectric element 22 adjacent to the liquid chamber 21. The functional liquid is fed into the liquid chamber 21 through a feed system 23 including a material tank to store the functional liquid. The piezoelectric element 22 is connected to a drive circuit 24. The piezoelectric element 22 distorts by application of a voltage through the drive circuit 24 to distort the liquid chamber 21, thereby ejecting the functional liquid from a discharge nozzle 25. The degree of distortion of the piezoelectric element 22 is controlled by changing the voltage applied. In addition, the rate of distortion is controlled by changing the frequency of the voltage applied. The droplet ejection by the piezoelectric system advantageously has less effect on the composition of the material because this system does not add heat to the material.

[First Intermediate Drying Step]

Figure 3A:
FIGS. 3(a)–(d) are schematics showing the method to form a patterned conductive film according to the exemplary embodiment of the present invention.

After the functional liquid containing the photothermal conversion material is applied onto the substrate 1, this liquid is optionally dried to remove the solvent (dispersion medium) and ensure a satisfactory thickness. For example, the drying may be conducted with a normal hot plate or electric furnace to heat the substrate 1, or by lamp annealing. In the first intermediate drying step, at least part of the liquid content of the functional liquid applied on the substrate 1 is removed to form a photothermal conversion layer 2 containing the photothermal conversion material on the substrate 1, as shown in FIG. 3(a). The first material application step and the first intermediate drying step may be repeated. A film of the functional liquid applied onto the substrate 1 can be excellently coated with another film of the functional liquid to provide the photothermal conversion layer 2 with a desired thickness. This first intermediate drying step may also be omitted.

[Second Material Application Step]

Another functional liquid containing a conductive material is applied onto the photothermal conversion layer 2 on the substrate 1. In this exemplary embodiment, the functional liquid used to form a patterned conductive film is a solution (dispersion) of an organic silver compound in diethylene glycol diethyl ether. In addition, the functional liquid used to form the patterned conductive film may be a dispersion of conductive microparticles in a dispersion medium. Examples of the conductive microparticles used include metal microparticles containing at least one of gold, silver, copper, aluminum, palladium, and nickel; microparticles of their oxides; conductive polymer microparticles; and superconductor microparticles. The dispersion medium used may be any material that can disperse the above conductive microparticles and does not aggregate them. Examples of the dispersion medium used include water; alcohols such as methanol, ethanol, propanol, and butanol; hydrocarbons such as n-heptane, n-octane, decane, dodecane, tetradecane, toluene, xylene, cymene, durene, indene, dipentene, tetrahydronaphthalene, decahydronaphthalene, and cyclohexylbenzene; ethers such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar compounds such as propylene carbonate, γ-butyrolactone, N-methyl-2-pyrrolidone, dimethylformamide, dimethyl sulfoxide, and cyclohexanone. Among them, water, alcohols, hydrocarbons, and ethers are preferred in view of the dispersibility of the microparticles, the stability of the dispersion, and the ease of application to droplet ejection, and water and hydrocarbons are particularly preferred.

After the functional liquid containing the conductive material is prepared, this liquid is applied onto the photothermal conversion layer 2 (the substrate 1) by a general film coating method such as extrusion coating, spin coating, gravure coating, reverse roll coating, rod coating, microgravure coating, and knife coating. In this coating, as in the first material application step, static charge on the surface of the substrate 1 is preferably eliminated to enable uniform application of the functional liquid onto the photothermal conversion layer 2 (the substrate 1). Thus the coating apparatus used is preferably equipped with a static eliminator. Naturally, the functional liquid containing the conductive material may be applied onto the photothermal conversion layer 2 (the substrate 1) by the droplet ejection (inkjetting) described above.

[Second Intermediate Drying Step]

Figure 3B:
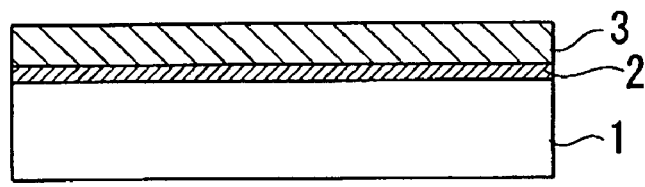

After the functional liquid containing the conductive material is applied onto the substrate 1, this liquid is optionally dried to remove the solvent (dispersion medium) and provide a satisfactory thickness. As in the first intermediate drying step, for example, the drying may be conducted with a normal hot plate or electric furnace to heat the substrate 1, or by lamp annealing. In the second intermediate drying step, at least part of the liquid content of the functional liquid applied on the photothermal conversion layer 2 (the substrate 1) is removed to form a conductive layer 3 containing the conductive material on the photothermal conversion layer 2, as shown in FIG. 3(b). The second material application step and the second intermediate drying step may be repeated. A film of the functional liquid applied onto the photothermal conversion layer 2 (the substrate 1) can be excellently coated with another film of the functional liquid to provide the conductive layer 3 with a desired thickness, thus addressing or achieving desired conductivity. This second intermediate drying step may also be omitted.

In this exemplary embodiment, as shown in FIG. 3(b), the photothermal conversion layer 2 is independently provided on the substrate 1 and is adjacent to the conductive layer 3.

[Firing Step]

The solvent (dispersion medium) contained in the conductive layer 3 on the substrate 1 must be completely removed to enhance or improve the electrical contact between the microparticles. In addition, if the conductive microparticles are coated with a coating material such as an organic material to enhance or improve the dispersibility, this coating material must be removed. Furthermore, if the functional liquid contains the organic silver compound as in this exemplary embodiment, the organic content of the organic silver compound must be removed by heat treatment to leave silver particles and attain conductivity. For at least the above reasons, the substrate 1, on which the conductive layer 3 is provided, is subjected to the firing step according to exemplary embodiments of the present invention.

Figure 4:
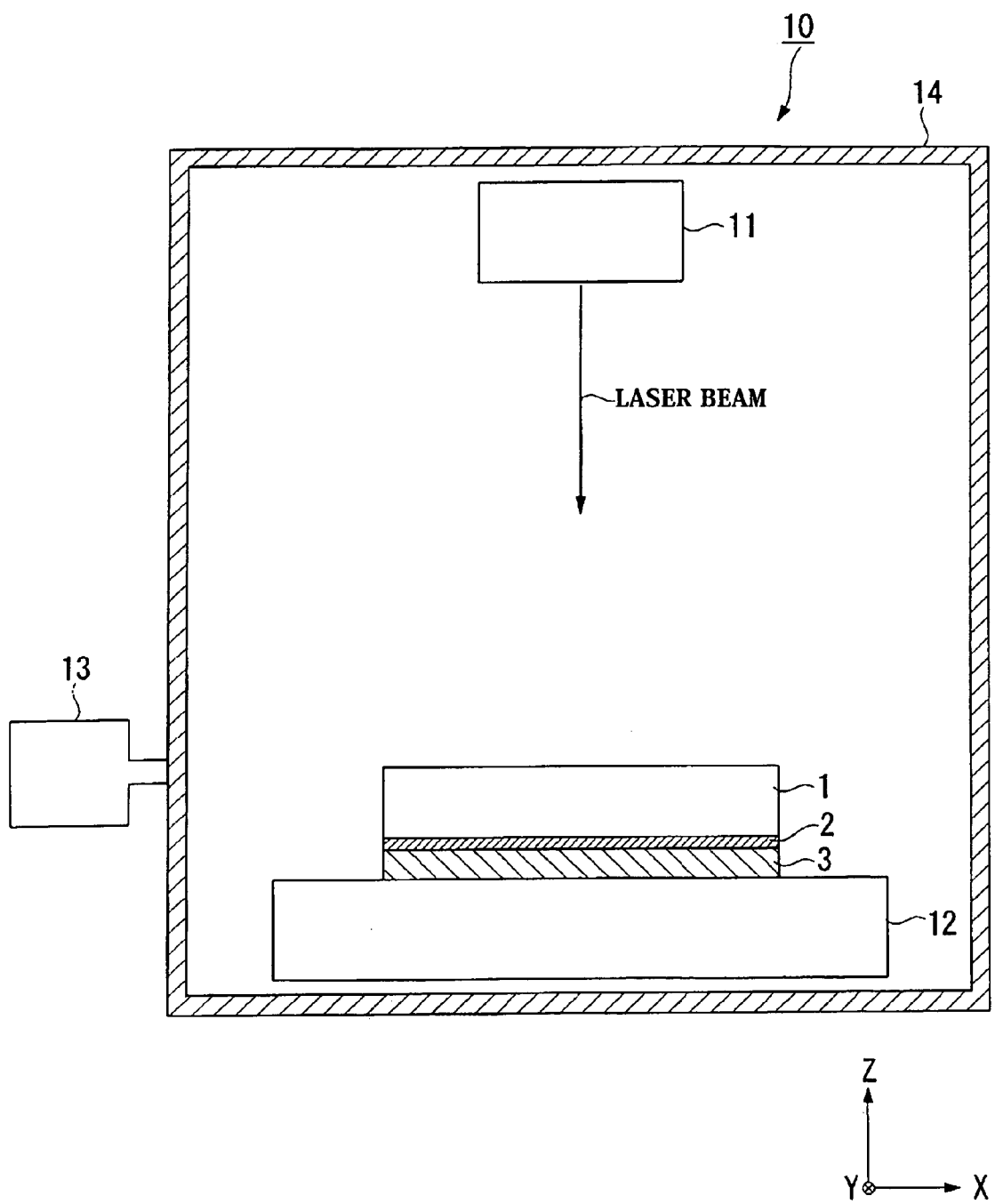
FIG. 4 is a schematic showing an example of the firing apparatus used in a firing step according to an exemplary embodiment of the present invention.

FIG. 4 is a schematic sectional view of an example showing the firing apparatus used in the firing step according to exemplary embodiments of the present invention. In FIG. 4, a firing apparatus 10 includes a laser source 11 to emit a laser beam with a predetermined wavelength and a stage 12 to support the substrate 1 having the photothermal conversion layer 2 and the conductive layer 3. In this exemplary embodiment, the substrate 1 is supported by the stage 12 such that the conductive layer 3 faces the stage 12. The laser source 11 and the stage 12 are disposed in a chamber 14. This chamber 14 is connected to a suction unit 13 capable of sucking gas out of the chamber 14. In this exemplary embodiment, a near-infrared semiconductor laser (wavelength: 830 nm) is used as the laser source 11.

In the following description, a predetermined direction in a horizontal plane is referred to as the x-axis direction; the direction orthogonal to the x-axis direction in the horizontal plane is referred to as the y-axis direction; and the direction (vertical direction) orthogonal to the x-axis direction and the y-axis direction is referred to as the z-axis direction.

The stage 12 can be moved in the x-axis direction and the y-axis direction while supporting the substrate 1; therefore, the substrate 1 can be moved with respect to a laser beam emitted from the laser source 11 as the stage 12 is moved. The stage 12 is also movable in the z-axis direction. An optical system (not shown in the drawing) is disposed between the laser source 11 and the substrate 1 supported by the stage 12. The position of the substrate 1 can be adjusted with respect to a focal point of the optical system by moving the stage 12 supporting the substrate 1 in the z-axis direction so that a laser beam emitted from the laser source 11 may be allowed to impinge on the substrate 1 supported by the stage 12.

In this exemplary embodiment, the stage 12 can be translated in the x-axis direction and the y-axis direction. If the substrate 1 is supported by a rotating drum, the rotating drum is movable in a horizontal translational direction (the scanning direction; the x-axis direction), a rotating direction (the y-axis direction), and the vertical direction (the z-axis direction).

Figure 3C:
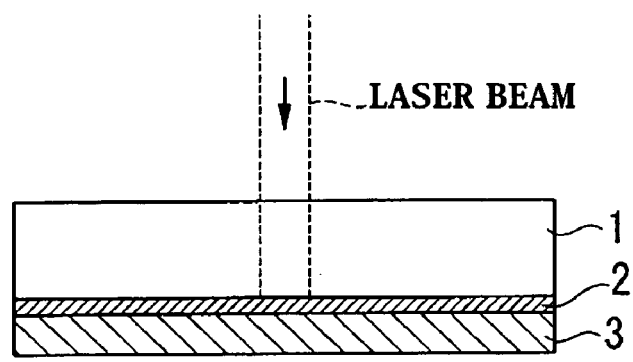
Figure 3D:
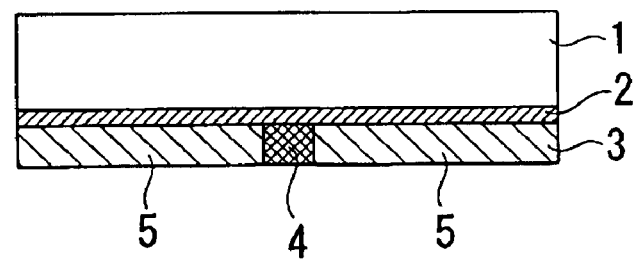

In the firing step, as schematically shown in FIG. 3(c), the laser source 11 emits a laser beam having a predetermined diameter to irradiate the surface of the substrate 1 on which the conductive layer 3 is not provided. The laser beam heats the irradiated region of the substrate 1 and the photothermal conversion layer 2. The photothermal conversion layer 2 then converts the light energy of the laser beam into heat energy and supplies the heat energy to the part of the conductive layer 3 corresponding to the irradiated region. As a result, the part of the conductive layer 3 is fired by sufficient heating with the heat energy supplied from the photothermal conversion layer 2 to provide electrical contact between the microparticles of the conductive material (the organic silver compound) in the part of the conductive layer 3, thus providing a patterned conductive film 4 having conductivity, as shown in FIG. 3(d).

If the stage 12 is moved in the xy plane with respect to the laser beam emitted, the part of the conductive layer 3 corresponding to the moving path of the stage 12 can be fired to pattern the conductive layer 3. Because the fired part of the conductive layer 3 becomes the patterned conductive film 4, the patterned conductive film 4 can have any pattern on the substrate 1 by moving the stage 12 along a predetermined moving path. Instead of the stage 12, the laser beam may be moved with respect to the substrate 1, or both of the laser beam and the stage 12 may be moved.

After the part of the conductive layer 3 is fired to form the patterned conductive film 4, the unfired part 5 of the conductive layer 3 may be removed (ashed). The ashing may be performed by a known method; for example, the unfired part 5 may be removed with a predetermined solvent or by laser irradiation. By such processing, a nonconductive part of the conductive layer 3 that does not function as the patterned conductive film 4 (wiring pattern) can be removed from the substrate 1. The unfired part 5 (the nonconductive part) may also be left on the substrate 1.

As described above, the photothermal conversion layer 2 provided on the substrate 1 can efficiently convert the light energy of the emitted light into heat energy to supply sufficient heat energy to fire the conductive layer 3. In this exemplary embodiment, the photothermal conversion layer 2 is irradiated with light through the substrate 1 to generate instantaneous high heat, thereby firing the conductive layer 3 in a short time. The conductive layer 3 can be fired and patterned at the same time, thus forming the patterned conductive film 4 (wiring pattern) with high productivity. In addition, the conductive layer 3 (the substrate 1) is instantaneously supplied with heat energy. Even if, for example, the substrate 1 is composed of a material having no heat resistance, such as a plastic, the effect on the substrate 1 can be reduced or suppressed. Furthermore, even if, for example, near-infrared laser beams are used instead of electron beams or ultraviolet rays, the photothermal conversion layer 2 can supply sufficient heat energy to fire the conductive layer 3. The photothermal conversion layer 2 therefore extends the range of choice of the light irradiation apparatus used. Without an expensive, large-scale light irradiation apparatus, the conductive layer 3 can be fired with sufficient heat energy through the photothermal conversion layer 2.

Figure 5:
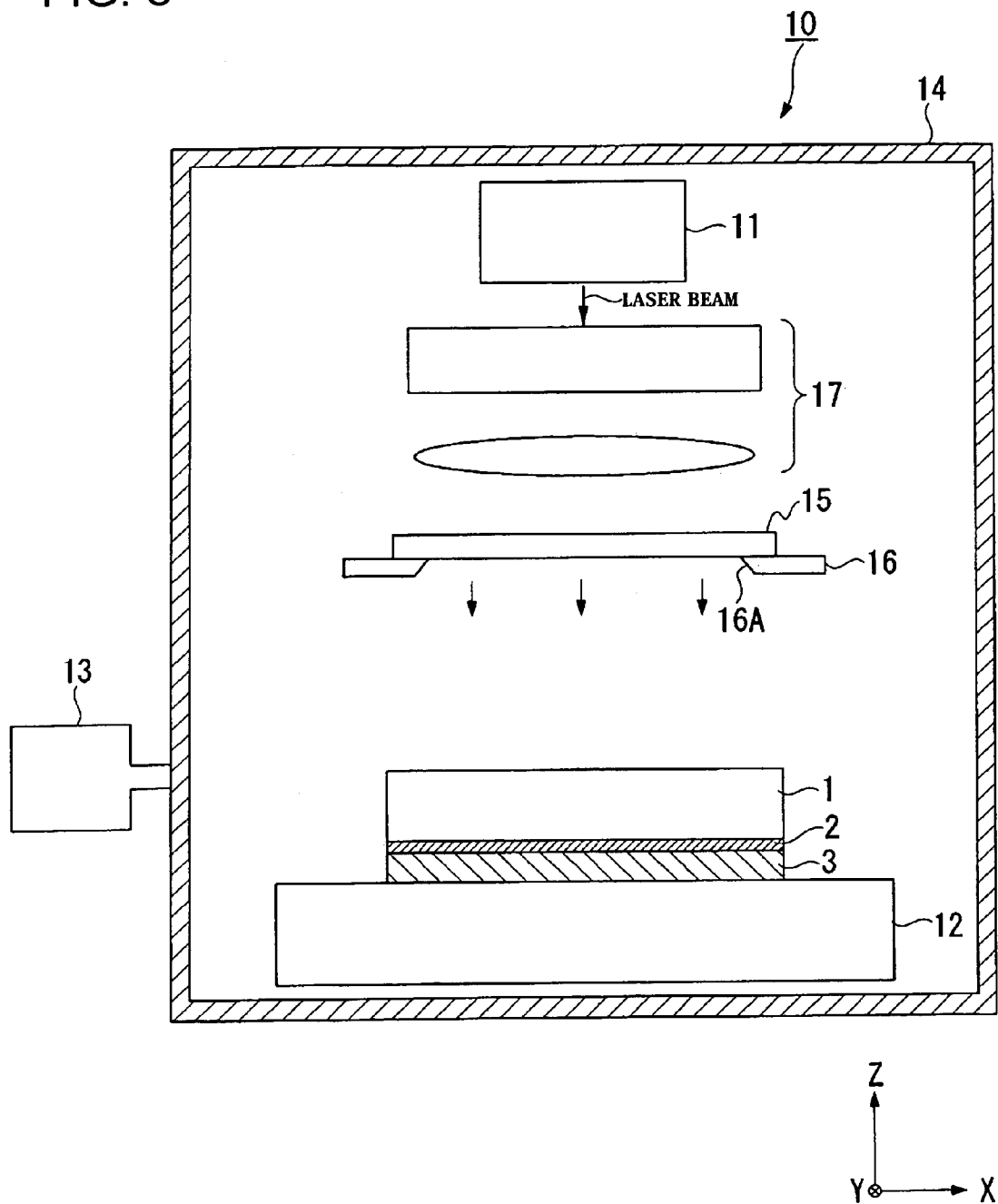
FIG. 5 is a schematic showing another example of the firing apparatus used in the firing step according to an exemplary embodiment of the present invention.
Figure 6A:
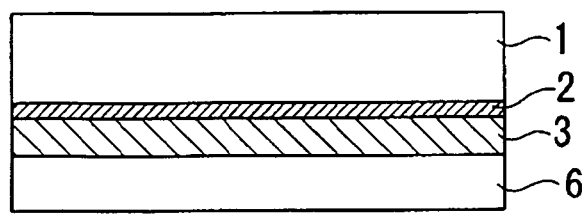
FIGS. 6(a)–(d) are schematics showing a method to form a patterned conductive film according to another exemplary embodiment of the present invention.
Figure 6B:
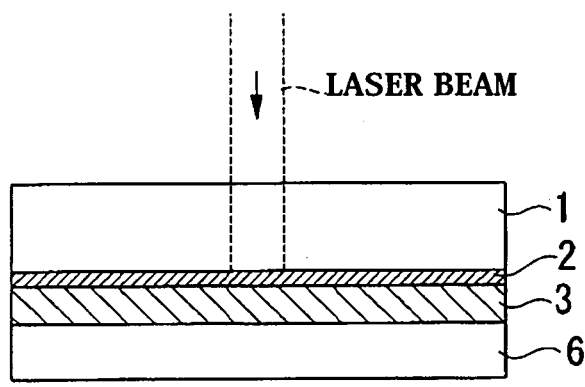
Figure 6C:
Figure 6D:
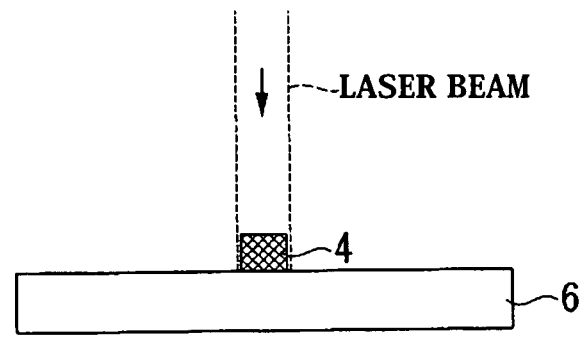

Referring to FIG. 5, in the firing of a predetermined part of the conductive layer 3, a laser beam may be allowed to pass through a mask 15 having a predetermined pattern and then impinge on the substrate 1. In FIG. 5, the mask 15 is supported by a mask supporter 16 having an opening 16A through which the laser beam passing through the mask 15 passes. An optical system 17 converts the laser beam emitted from the laser source 11 into illuminating light having a uniform luminance distribution. The illuminating light illuminates the mask 15, and the light passing through the mask 15 impinges on the substrate 1 supported by the stage 12. The irradiation through the mask 15 enables the formation of a conductive film having a pattern finer than the diameter of the laser beam emitted. On the other hand, the preparation of the mask 15 can be eliminated if the conductive layer 3 is patterned by laser irradiation while moving the substrate 1 with respect to the laser beam as in the exemplary embodiment described with reference to FIG. 4.

The photothermal conversion layer 2 and the conductive layer 3, which are adjacent in this exemplary embodiment, may be separated by another layer. For example, the photothermal conversion layer 2 is provided on one surface of the substrate 1 while the conductive layer 3 is provided on the other surface of the substrate 1. In this structure, the heat energy generated in the photothermal conversion layer 2 can be supplied to the conductive layer 3 through the substrate 1 (another layer) to fire the conductive layer 3. If, on the other hand, the photothermal conversion layer 2 and the conductive layer 3 are adjacent, the heat energy generated in the photothermal conversion layer 2 can be efficiently supplied to the conductive layer 3.

In this exemplary embodiment, for example, an intermediate layer to enable uniform photothermal conversion may be provided between the photothermal conversion layer 2 and the conductive layer 3. The material to form the intermediate layer is exemplified by a resin that can satisfy the above requirement. This intermediate layer may be formed after the formation of the photothermal conversion layer 2 on the substrate 1 (namely, after the first intermediate drying step S2) by applying a resin composition having a predetermined composition onto the photothermal conversion layer 2 and drying the applied resin. The coating may be performed by a known coating method such as spin coating, gravure coating, and dye coating. The photothermal conversion layer 2 converts the light energy of the emitted laser beam into heat energy, which is homogenized by the intermediate layer. As a result, uniform heat energy is supplied to the part of the conductive layer 3 corresponding to the irradiated region.

The substrate 1, which is irradiated with a laser beam at the side on which the conductive layer 3 is not provided in this exemplary embodiment, may be irradiated with a laser beam at the side on which the conductive layer 3 is provided. The photothermal conversion layer 2 is irradiated with a laser beam through the conductive layer 3 to convert its light energy into heat energy and supply the heat energy to the conductive layer 3. If, on the other hand, the substrate 1 is irradiated with a laser beam at the side on which the conductive layer 3 is not provided as in this exemplary embodiment, the photothermal conversion layer 2 can be directly irradiated through the substrate 1, which is transparent. The photothermal conversion layer 2 can therefore efficiently convert the light energy of the laser beam into heat energy.

The photothermal conversion material, which is provided as an independent layer (the photothermal conversion layer 2) in this exemplary embodiment, may be mixed in the substrate 1. This substrate 1 can convert the light energy of the emitted laser beam into heat energy and supply the heat energy to the conductive layer 3. In addition, the photothermal conversion layer 2 may be provided on the substrate 1 containing the photothermal conversion material.

If the photothermal conversion layer 2 is provided, it is preferably irradiated with light having a wavelength according to the photothermal conversion material used. Different photothermal conversion materials suitably absorb light having different wavelengths; hence, irradiation with light having a wavelength according to the photothermal conversion material used allows efficient conversion of light energy into heat energy. In other words, the photothermal conversion material is selected according to the light used. In this exemplary embodiment, a photothermal conversion material having the property of absorbing infrared to visible light is preferred since a near-infrared semiconductor laser (wavelength: 830 nm) is used as the laser source 11.

In this exemplary embodiment, the laser source 11 is not limited to a near-infrared semiconductor laser; for example, a mercury lamp, a halogen lamp, a xenon lamp, or a flash lamp may be used as the laser source 11. In addition to a near-infrared semiconductor laser, all general lasers may be used, including an ultraviolet laser.

In this exemplary embodiment, the patterned conductive film 4 is formed on the substrate 1. The patterned conductive film 4 may also be formed on a predetermined board 6 by bringing the board 6 into contact with the conductive layer 3 on the substrate 1, as shown in FIG. 6(*a*), and irradiating a predetermined region of the substrate 1 with a laser beam, as shown in FIG. 6(*b*), to transfer the part of the conductive layer 3 corresponding to the irradiated region onto the board 6, as shown in FIG. 6(*c*). In addition, as shown in FIG. 6(*d*), the patterned conductive film 4 transferred onto the board 6 may be further fired by laser irradiation. The board 6 is composed of, for example, a glass plate, a synthetic resin film, or a semiconductor wafer.

The patterned conductive film 4 can be smoothly transferred onto the board 6 by irradiating the substrate 1 with a laser beam while bringing the board 6 into close contact with the conductive layer 3. The conductive layer 3 and the board 6 may be brought into close contact by placing the substrate 1 and the board 6 on the stage 12 in the firing apparatus 10 shown in FIG. 4 such that the conductive layer 3 on the substrate 1 and the board 6 come in contact; and driving the suction unit 13 to create a negative pressure in the chamber 14. After the laser irradiation, the conductive layer 3 on the substrate 1 and the board 6 may be separated by stopping the suction unit 13 to relieve the negative pressure.

If the part of the conductive layer 3 is transferred onto the board 6, a gas-generating layer containing a gas-generating material that generates a gas in response to light irradiation may be provided between the substrate 1 (the photothermal conversion layer 2) and the conductive layer 3. The gas-generating material absorbs light or heat energy converted from light energy to decompose into gases such as nitrogen and hydrogen. The generated gases provide energy to separate the conductive layer 3 from the substrate 1. Examples of the gas-generating material used include at least one material selected from the group consisting of pentaerythritol tetranitrate (PETN) and trinitrotoluene (TNT).

[Exemplary Example]

A polycarbonate sheet having a thickness of about 0.2 mm was used as the substrate 1. This sheet was coated with a thermosetting epoxy resin containing carbon black with a thickness of about 2 µm. This coating was cured to provide the photothermal conversion layer 2. The photothermal conversion layer 2 was further coated with a functional liquid (silver ink) containing silver microparticles to form the conductive layer 3 (silver ink layer). This sheet was then supported on a rotating drum with the conductive layer 3 inside. While rotating the rotating drum at 50 rpm, the sheet was irradiated twice with a laser beam having a wavelength of 830 nm by a near-infrared semiconductor laser having an output of 14 W. The diameter of the laser beam emitted was adjusted such that the wiring pattern to be formed (the patterned conductive film 4) had a line width of 1 mm. After the irradiation, the silver ink showed a silver color and exhibited an electrical resistance of 30 Ω/cm. On the other hand, the unirradiated region (the unfired part) exhibited an electrical resistance of ∞Ω/cm. These results confirmed that the irradiated region developed conductivity.

[Plasma Display]

Figure 7:
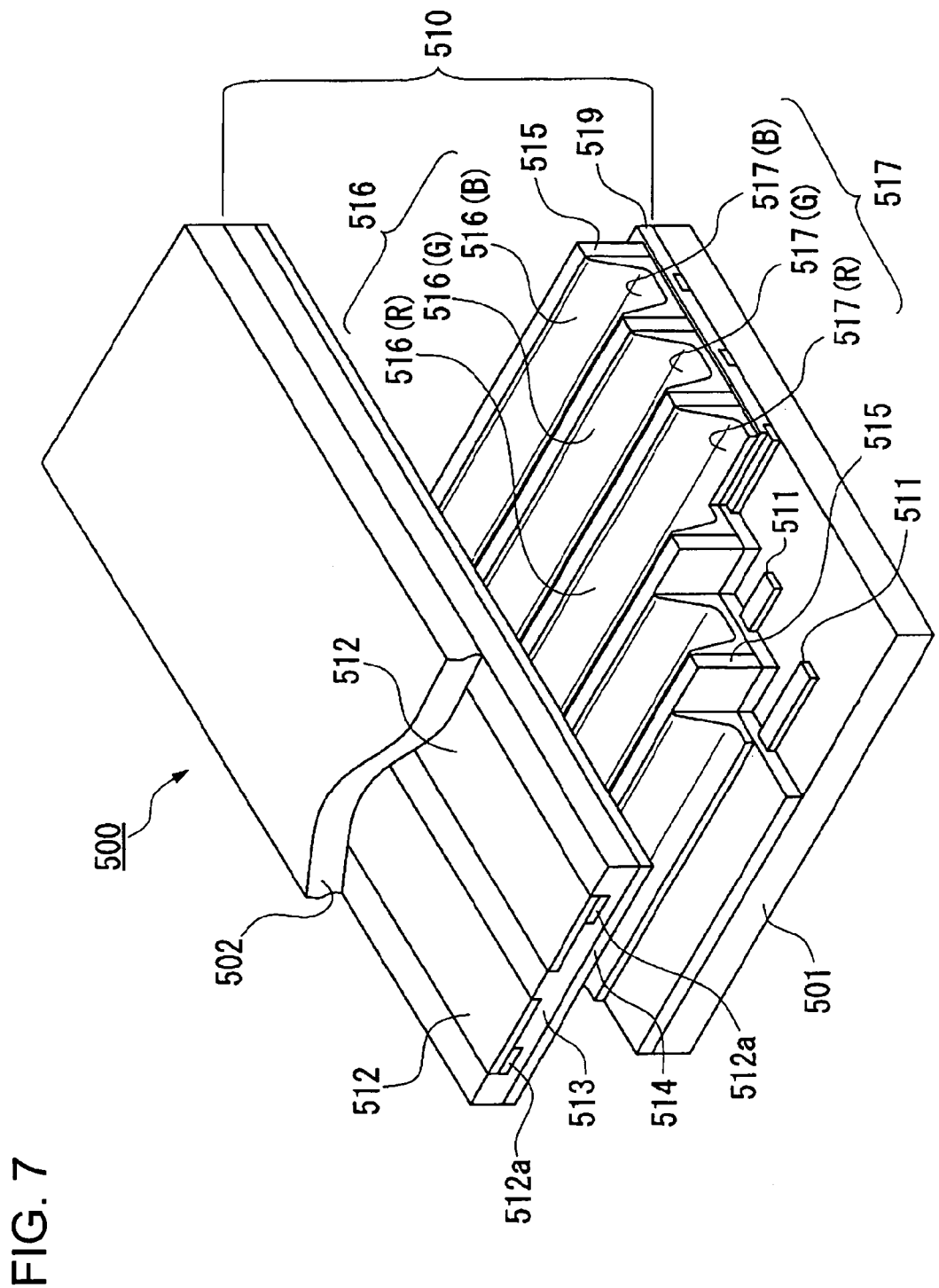
FIG. 7 is a schematic showing an exploded perspective view of a plasma display that is an example of electrooptical devices including a wiring pattern formed by the method to form a patterned conductive film according to an exemplary embodiment of the present invention.

A plasma display will now be described with reference to FIG. 7 as an example of electrooptical devices having a patterned conductive film (wiring pattern) formed by the method to form a patterned conductive film according to exemplary embodiments of the present invention. FIG. 7 is an exploded perspective view of a plasma display 500 including address electrodes 511 and bus electrodes 512a. This plasma display 500 is broadly composed of a glass substrate 501, another glass substrate 502 opposed to the glass substrate 501, and a discharge display part 510 disposed between the glass substrates 501 and 502.

The discharge display part 510 includes discharge cells 516. Each pixel includes a red discharge cell 516(R), a green discharge cell 516(G), and a blue discharge cell 516(B). The address electrodes 511 are formed in stripes at predetermined intervals on the top surface of the glass substrate 501. These address electrodes 511 and the top surface of the glass substrate 501 are covered with a dielectric layer 519. Partitions 515 are formed on the dielectric layer 519. These partitions 515 are disposed between the address electrodes 511 and extend along the address electrodes 511. The partitions 515 also extend in the direction orthogonal to the address electrodes 511 at predetermined intervals in the longitudinal direction (not shown in the drawing). Basically, rectangular regions are defined by the partitions 515 extending along the address electrodes 511 on both sides of the address electrodes 511 in the width direction and the partitions 515 extending in the direction orthogonal to the address electrodes 511. These rectangular regions correspond to the discharge cells 516; therefore, each pixel includes three rectangular regions. Phosphors 517 are disposed inside the rectangular regions defined by the partitions 515. The phosphors 517 show red, green, or blue fluorescence: a red phosphor 517(R) is disposed on the bottom of each red discharge cell 516(R); a green phosphor 517(G) is disposed on the bottom of each green discharge cell 516(G); and a blue phosphor 517(B) is disposed on the bottom of each blue discharge cell 516(B).

Transparent display electrodes 512 composed of ITO are provided on the glass substrate 502. These display electrodes 512 are formed in stripes at predetermined intervals in the direction orthogonal to the address electrodes 511. The bus electrodes 512a, which are composed of a metal, are formed to assist the display electrodes 512 because ITO has high resistance. The display electrodes 512 and the bus electrodes 512a are covered with a dielectric layer 513 and a protective layer 514 composed of, for example, MgO. The glass substrates 501 and 502 are bonded such that the address electrodes 511 and the display electrodes 512 are orthogonal to each other. The spaces surrounded by the glass substrate 501, the partitions 515, and the protective layer 514 formed on the glass substrate 502 are evacuated and filled with a noble gas to form the discharge cells 516. Each discharge cell 516 is formed across two display electrodes 512 on the glass substrate 502. The address electrodes 511 and the display electrodes 512 are connected to an AC power supply (not shown in the drawing). The passage of current through the address electrodes 511 and the display electrodes 512 excites the phosphors 517 at necessary positions in the discharge display part 510. The phosphors 517 then emit light to provide a color display.

In this example, the address electrodes 511 and the bus electrodes 512a are formed by the method to form a patterned conductive film according to exemplary embodiments of the present invention because this method is particularly suitable for their patterning. The address electrodes 511 and the bus electrodes 512a are formed by ejecting, drying, and firing a functional liquid in which metal colloid particles (for example, gold colloid particles or silver colloid particles) or conductive microparticles (for example, metal microparticles) are dispersed. In addition, the phosphors 517 may be formed by ejecting a functional liquid prepared by dissolving (dispersing) a fluorescent material in a solvent (dispersion medium) from the discharge head 20 and drying and firing the liquid.

In this example, the plasma display was described as an example of electrooptical devices. The method to form a patterned conductive film according to exemplary embodiments of the present invention may also be applied to the formation of wiring patterns for organic EL devices and liquid crystal displays.

[Electronic Appliance]

Figure 8A:
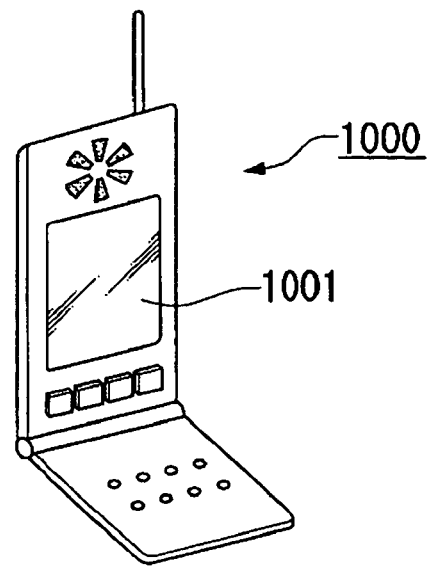
FIGS. 8(a)–(c) are schematics that show examples of electronic appliances including an electrooptical device of exemplary embodiments of the present invention.
Figure 8B:
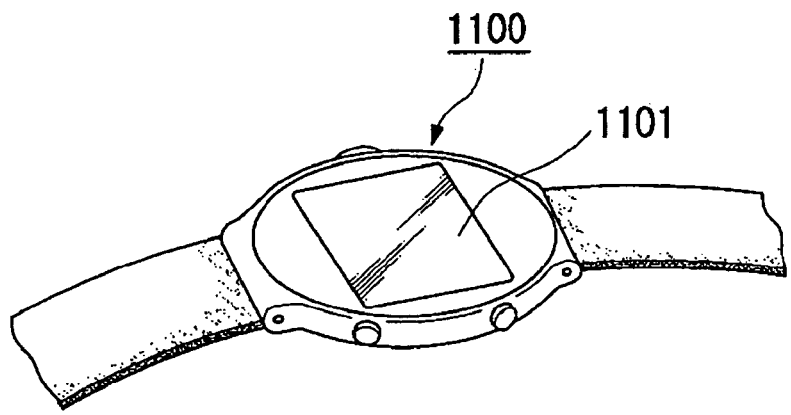
Figure 8C:
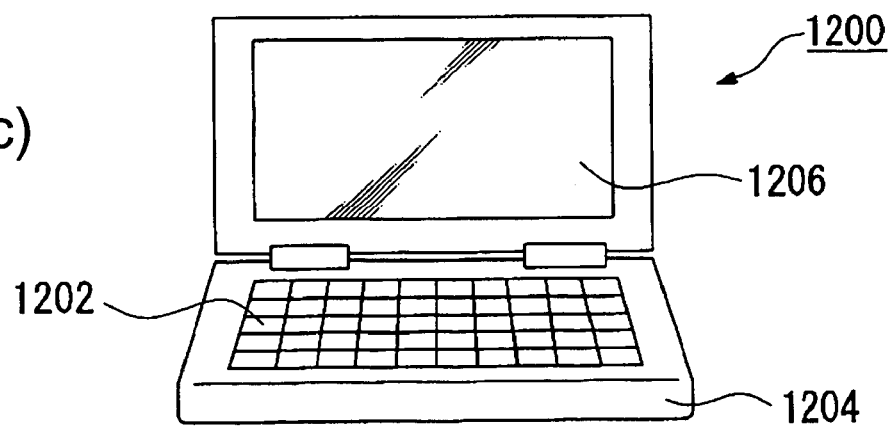

An example of electronic appliances including the above exemplary electrooptical device (for example, an organic EL display, a plasma display, or a liquid crystal display) will now be described. FIG. 8(a) is a schematic perspective view of an example of cellular phones. In FIG. 8(a), a cellular phone 1000 has a display part 1001 including the above electrooptical device. FIG. 8(b) is a schematic perspective view of an example of wristwatch electronic appliances. In FIG. 8(b), a wristwatch 1100 has a display part 1101 including the above electrooptical device. FIG. 8(c) is a schematic perspective view of an example of mobile information processors such as word processors and PCs. In FIG. 8(c), an information processor 1200 includes an input device 1202 such as a keyboard, a main unit 1204, and a display part 1206 including the above electrooptical device. The electronic appliances in FIGS. 8(a), 8(b), and 8(c), including the electrooptical device of the above exemplary embodiment, provide a high-quality, bright display.

Other examples of electronic appliances according to exemplary embodiments of the present invention include liquid crystal television sets, camcorders with a viewfinder or monitor, car navigation systems, pagers, electronic organizers, calculators, word processors, work stations, videophones, POS terminals, electronic paper, and devices with touch panels. The electrooptical device of exemplary embodiments of the present invention may be applied to a display for such electronic appliances.

What is claimed is:

1. A method to form a patterned conductive film, comprising:
   irradiating with light a substrate that is provided with a conductive layer, the conductive layer including a conductive material and a photothermal conversion material that converts light energy into heat energy to fire at least part of the conductive layer with the photothermal conversion material; and
   mixing the photothermal conversion material in the substrate.

2. The method to form a patterned conductive film according to claim 1, further comprising:
   irradiating a predetermined region of the substrate with light to pattern the conductive layer.

3. The method to form a patterned conductive film according to claim 1, further comprising:
   applying a functional liquid including the conductive material, onto the substrate including the photothermal conversion material, before the firing of at least part of the conductive layer.

4. The method to form a patterned conductive film according to claim 3, further comprising:
   drying the functional liquid applied onto the substrate between the material application and the firing.

5. The method to form a patterned conductive film according to claim 1, further comprising:
   providing a photothermal conversion layer including the photothermal conversion material, independently on the substrate such that the photothermal conversion layer and the conductive layer are adjacent on the substrate.

6. The method to form a patterned conductive film according to claim 1, further comprising:
   removing an unfired part of the conductive layer after the firing of at least part of the conductive layer.

7. The method to form a patterned conductive film according to claim 1, further comprising:
   irradiating the substrate with light on a side on which the conductive layer is provided.

8. The method to form a patterned conductive film according to claim 1, further comprising:
   irradiating the substrate with light on the side on which the conductive layer is not provided.

9. The method to form a patterned conductive film according to claim 1, further comprising:
   forming a patterned conductive film on a predetermined board by bringing the board into contact with the conductive layer on the substrate; and
   irradiating a predetermined region of the substrate with light to transfer a part of the conductive layer corresponding to the predetermined region onto the board.

10. The method to form a patterned conductive film according to claim 9, further comprising:
    irradiated further with light, the patterned conductive film transferred onto the board.

11. The method to form a patterned conductive film according to claim 1, the light being a laser beam.

12. The method to form a patterned conductive film according to claim 1, the irradiation being performed with light having a wavelength according to the photothermal conversion material.

13. The method to form a patterned conductive film according to claim 1, the irradiation being performed through a mask having a predetermined pattern to irradiate the substrate with light passing through the mask.

14. The method to form a patterned conductive film according to claim 1, the irradiation being performed while relatively moving the substrate with respect to the light.

* * * * *